(12) United States Patent
Chowdhury et al.

(10) Patent No.: US 12,100,560 B2
(45) Date of Patent: Sep. 24, 2024

(54) HIGH-PERFORMANCE CAPACITOR PACKAGING FOR NEXT GENERATION POWER ELECTRONICS

(71) Applicant: UT-Battelle, LLC, Oak Ridge, TN (US)

(72) Inventors: Shajjad Chowdhury, Oak Ridge, TN (US); Raj Sahu, Mountain View, CA (US); Emre Gurpinar, Knoxville, TN (US); Burak Ozpineci, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 328 days.

(21) Appl. No.: 17/742,690

(22) Filed: May 12, 2022

(65) Prior Publication Data

US 2022/0375691 A1 Nov. 24, 2022

Related U.S. Application Data

(60) Provisional application No. 63/189,727, filed on May 18, 2021.

(51) Int. Cl.
*H01G 4/38* (2006.01)
*H01G 4/232* (2006.01)
(Continued)

(52) U.S. Cl.
CPC ............... *H01G 4/38* (2013.01); *H01G 4/232* (2013.01); *H05K 1/162* (2013.01); *H01G 4/1245* (2013.01); *H05K 2201/09227* (2013.01)

(58) Field of Classification Search
CPC ........... H05K 1/18; H05K 1/181; H05K 1/16; H05K 1/162; H05K 1/0231
(Continued)

(56) References Cited

U.S. PATENT DOCUMENTS

| 10,084,310 | B1 | 9/2018 | Neely et al. |
| 2005/0024813 | A1* | 2/2005 | Shimizu ................. H05K 1/181 |
| | | | 361/328 |

(Continued)

OTHER PUBLICATIONS

J.W. Kolar and S.D. Round, "Analytical calculation of the RMS current stress on the DC-link capacitor of voltage-PWM converter systems", IEE Proceedings—Electric Power Applications, vol. 153, No. 4, pp. 535-543, 2006.

(Continued)

*Primary Examiner* — Binh B Tran
(74) *Attorney, Agent, or Firm* — Warner Norcross + Judd LLP

(57) ABSTRACT

A capacitor packaging having a central termination and three or more capacitors (or groups of capacitors) arranged about the central termination. The electrical flow paths between the termination and the capacitors or groups of capacitors are of substantially the same length. The capacitors or groups of capacitors may be arranged in a generally circular pattern with the termination centered on the center. The termination may include first and second terminals. The capacitors may be mounted to a printed circuit board ("PCB") with traces on opposite surfaces of the PCB providing electrical flow paths from the terminals to opposite legs of the capacitors. The capacitor packaging may include a primary PCB with a first circular arrangement of capacitors and a secondary PCB with a second circular arrangement of capacitors. The capacitors may be sandwiched between the PCBs with the second arrangement of capacitors disposed concentrically inwardly of the first arrangement.

21 Claims, 17 Drawing Sheets
(2 of 17 Drawing Sheet(s) Filed in Color)

(51) Int. Cl.
*H05K 1/16* (2006.01)
*H01G 4/12* (2006.01)

(58) Field of Classification Search
USPC .......................................................... 361/748
See application file for complete search history.

(56) References Cited

U.S. PATENT DOCUMENTS

2006/0113850 A1\* 6/2006 Togashi ............... H02K 11/026
310/72
2009/0009980 A1\* 1/2009 Ward .................... H02M 7/003
361/748

OTHER PUBLICATIONS

M. Vujacic, M. Hammami, M. Srndovic, and G. Grandi, "Evaluation of DC Voltage Ripple in Three-Phase PWM Voltage Source Inverters", in 2017 IEEE 26th International Symposium on Industrial Electronics (ISIE), 2017, pp. 711-716.

Joshua Stewart, J. Neely, J. Delhotal, and J. Flicker, "DC Link Bus Design for High Frequency, High Temperature Converters", 2017 IEEE Applied Power Electronics Conference and Exposition (APEC), Tampa, FL, 2017, pp. 809-815.

Gui-Jia Su and Lixin Tang, "A Segmented Traction Drive System with a Small dc Bus Capacitor", Energy and Transportation Science Division Oak Ridge National Laboratory, in Proc. IEEE Energy Convers. Congr. Expo. (ECCE), Sep. 2012, pp. 2847-2853.

Shajjad Chowdhury, E. Gurpinar, and B. Ozpineci, "High-Energy Density Capacitors for Electric Vehicle Traction Inverters", in Proc. IEEE Transp. Electric. Conf. Expo (ITEC), Jun. 2020, pp. 644-650.

\* cited by examiner

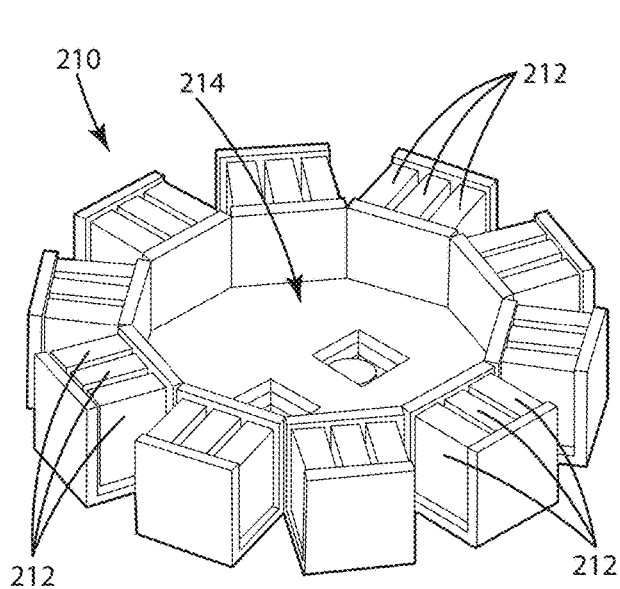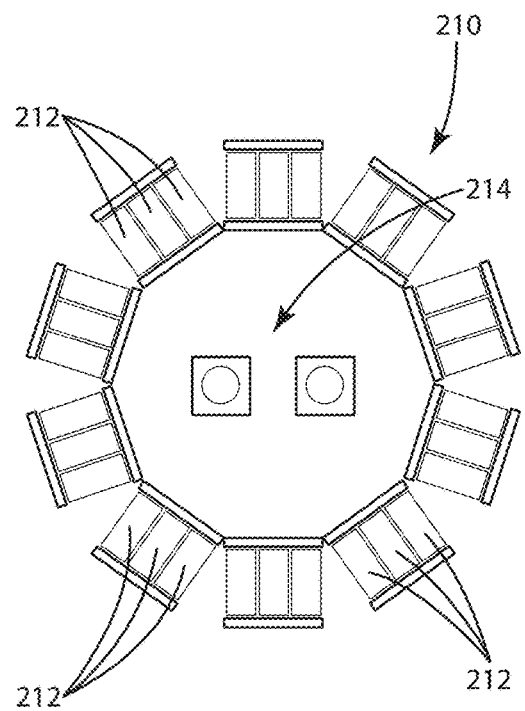
Fig. 4A    Fig. 4B
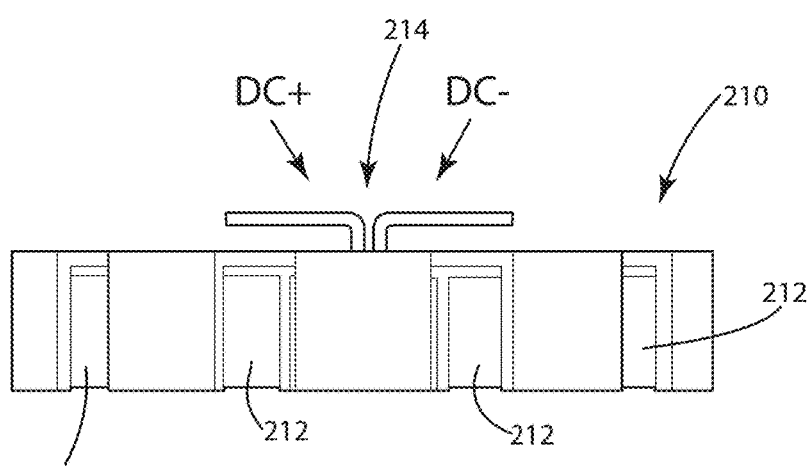
Fig. 4C

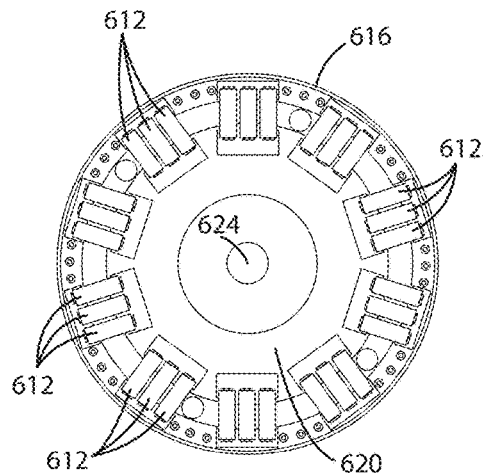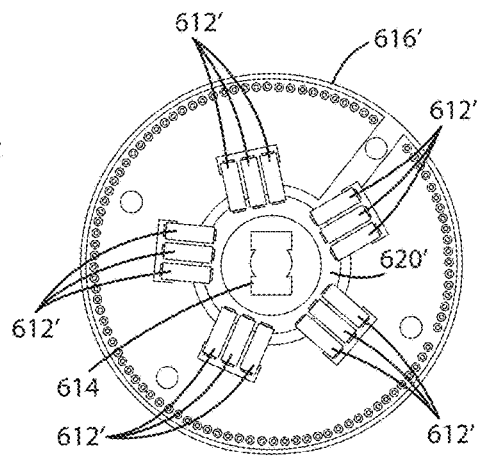
Fig. 13A  Fig. 13B
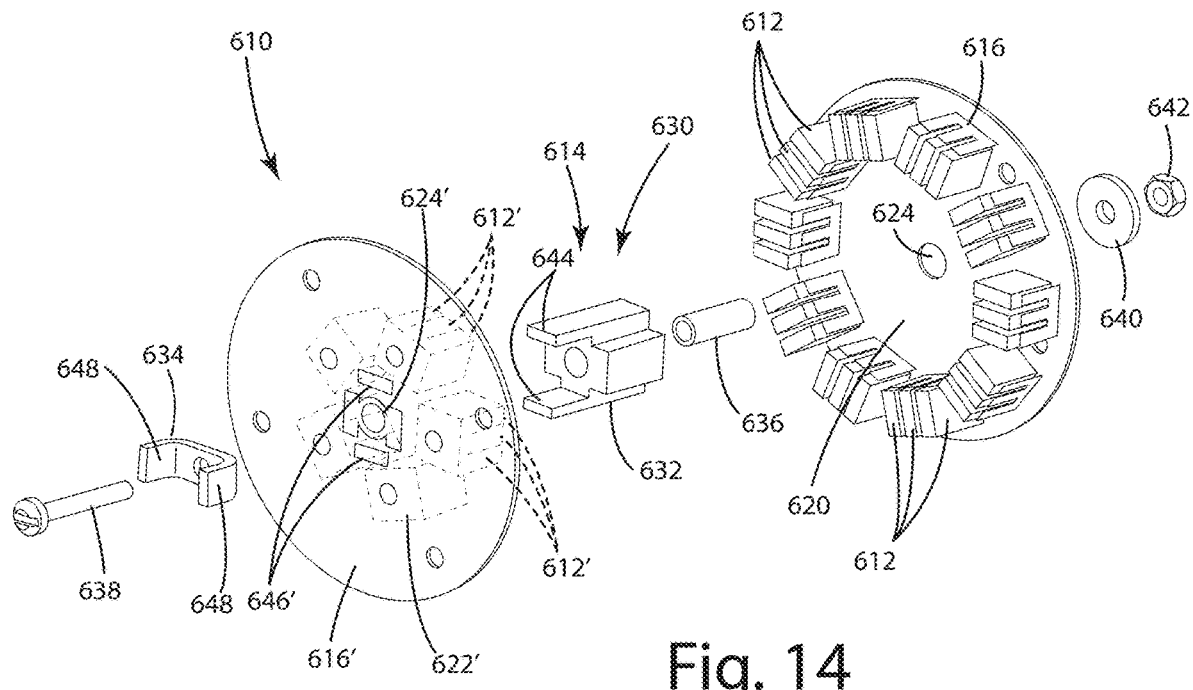
Fig. 14

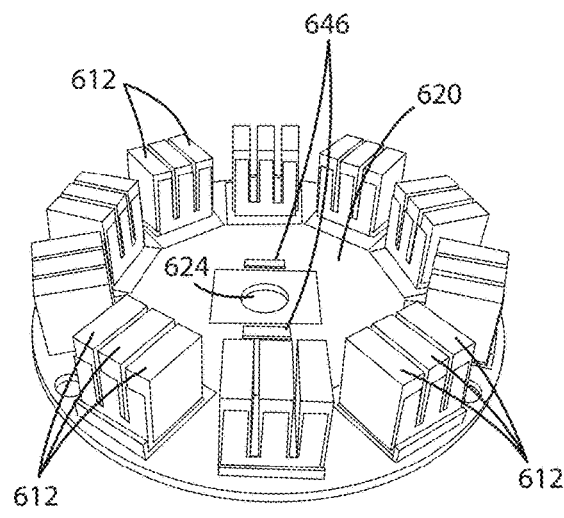
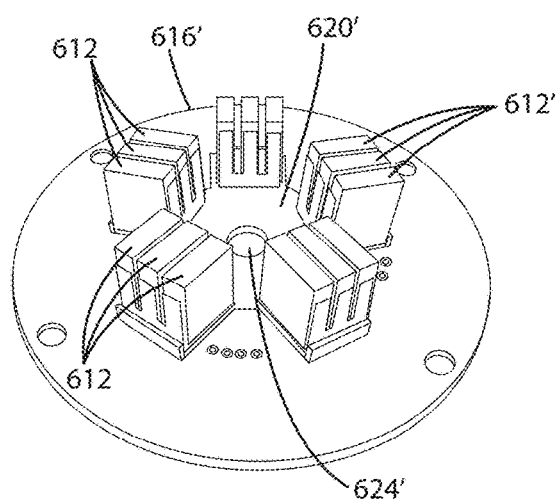
Fig. 15A  Fig. 15B
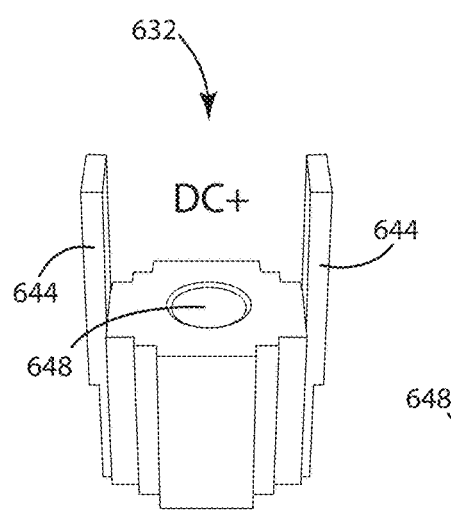
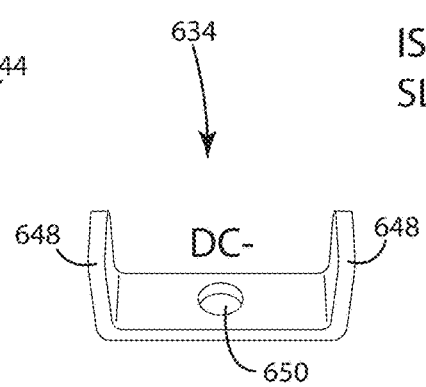
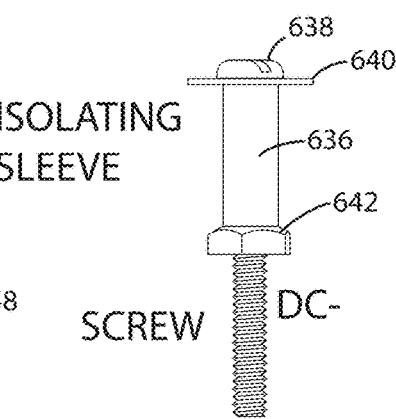
Fig. 16A  Fig. 16B  Fig. 16C

HIGH-PERFORMANCE CAPACITOR PACKAGING FOR NEXT GENERATION POWER ELECTRONICS

STATEMENT REGARDING FEDERALLY SPONSORED RESEARCH

This invention was made with government support under Contract No. DE-AC05-00OR22725 awarded by the U.S. Department of Energy. The government has certain rights in the invention.

FIELD OF THE INVENTION

The present invention relates to electrical systems, and more particularly to systems and methods for packaging capacitors in electrical systems.

BACKGROUND OF THE INVENTION

Capacitors are one of essential passive components used in electric drives to store energy, suppress high-frequency components, and regulate current flow. The vast majority of these capacitors are used as a DC bus in a voltage source inverter (VSI) to decouple the load from the supply. Thus, a capacitor absorbs a large ripple current due to the inverter switching action. The DC bus capacitor for a three-phase VSI can take up to 60% of the root mean square (RMS) load current. Moreover, the capacitor bank is configured to store a certain amount of energy to maintain a stable DC voltage level. Thus, the DC bus capacitor can take a substantial volume within an inverter, limiting the inverter's power density.

Several types of capacitors can be used in electric drive applications, which can be divided into two primary groups: electrostatic and electrolytic capacitors. Among all the available capacitor technologies, the use of ceramic-based capacitors may loosen the restriction on an inverter's power density but imposes a challenge on electrical performance. Similar to film and aluminum electrolytic capacitors, the ceramic capacitor cannot be produced as a large block, mainly due to the brittle nature of ceramic materials. Thus, several hundreds of them may be required for DC bus application. Issues around the packaging of such a large number of capacitors can adversely impact electric drive's performance. Current asymmetry may be introduced among the parallel capacitor branches if packaging issues are not addressed. Moreover, additional layout inductance will lead to large voltage oscillation across semiconductor devices. Thus, special care is needed when packaging these large number capacitors for traction applications.

A conventional capacitor packaging technique uses flat design, where a large number of capacitors are connected in parallel to achieve the required capacitance and current handling capacity. This type of packaging has termination on one side, which introduce asymmetrical impedance path for the current flow, as shown in FIG. 1 (Prior Art). In this type of packaging, there is a temperature difference between parallel capacitor branches. The difference in temperature is shown in FIG. 1 by variations in the thickness of the lines forming the capacitors with the thicker lines representing higher temperatures. In general, the high frequency current flow and temperature of a capacitor in this capacitor package is dictated by its distance, d, from the termination. As can be seen, the capacitors in the row adjacent the termination are the shortest distance, d, from the termination and have the highest current flow and highest temperature. Each row that is progressively farther away from the termination (e.g. 2d, 3d, 4d and 5d) has progressively lower current flow and lower temperature.

Thus, the nearest capacitor relative to the termination, which will take higher current than the others, is more likely to fail due to thermal stress. Moreover, the return current path may not be overlapping due to the asymmetrical distribution of capacitors from the termination point. Thus, the overall layout inductance will be high.

As a result, there is a need for improved systems and methods for packaging capacitors in electrical systems. The need for an improved capacitor package is heightened in applications that require a large number of capacitors, such as DC bus and other power electronics applications.

SUMMARY OF THE INVENTION

The present invention provides a system and method for providing improved packaging of capacitors, for example, in the power electronics applications. The capacitor packaging includes a capacitor arrangement having a central termination and three or more capacitors arranged about and at substantially equal distances from the central termination. The termination may include a first terminal electrically connected with a first leg of each of the plurality of capacitors and a second terminal to be electrically connected with a second leg of each of the plurality of capacitors.

In one embodiment, the capacitors are arranged in a generally circular pattern about the central termination. In such embodiments, the central termination may be disposed at the center of a circle and each capacitor may be disposed on that circle. For example, in one embodiment, the plurality of capacitors are disposed at different spaced-apart locations about the circumference of a circle and the central termination is centered on the center of that circle.

In one embodiment, the plurality of capacitors are generally identical to one another and each capacitor is oriented at a common angle with respect to the center. For example, in one embodiment, each capacitor has a central axis and is oriented so that, when extended, its central axis extends approximately through the center of the circle.

In one embodiment, the capacitors are arranged about the center in a radially symmetric pattern with adjacent capacitors being equidistant from each other. For example, in one embodiment, the capacitor packaging includes five capacitors arranged at 72-degree intervals about the circle. In another example, the capacitor packaging includes ten capacitors arranged about the circle at 36-degree intervals. In yet another example, the capacitor packaging includes three capacitors arranged at 120-degree intervals about the center.

In one embodiment, adjacent capacitors are disposed immediately adjacent one another to substantially fill the circumference of the circle. For example, the capacitors may be arranged close enough that the capacitor packaging includes the maximum number of capacitors capable of being fitted about the circle.

In one embodiment, the capacitor packaging includes first and second electrical flow paths that are capable of supplying to and/or returning power from the capacitor. In one embodiment, the first and second electrical flow paths are of substantially the same length.

In one embodiment, the termination includes a first terminal and a second terminal, and both terminals are substantially centered on the center of the circle.

In one embodiment, the capacitor packaging includes a substrate upon which the capacitors are mounted. The substrate may be a printed circuit board ("PCB"). In one embodiment, the substrate may be a circular PCB of just the right size to accommodate the circular arrangement of capacitors. In one embodiment, the PCB may include a trace on one major surface that connect the first terminal to one leg of each capacitor and a second trace on the other major surface that connects the second terminal to the other leg of each capacitor.

In one embodiment, the capacitors are arranged in groups, and the groups (rather than the individual capacitors) are disposed at substantially the same distance from the termination. The groups each share a common arrangement of capacitors to provide enhanced symmetry. For example, the plurality of capacitors in each group may be aligned in a substantially radial direction or in a substantially circumferential direction.

In one embodiment, the capacitor packaging includes a primary board that carries a first plurality of capacitors arranged in a circular pattern and a secondary board that includes a second plurality of capacitors arranged in a second circular pattern about a termination. In one embodiment, the primary board and the secondary board are joined together with the first and second plurality of capacitors sandwiched between the primary board and the secondary board and arranged about a common center.

In one embodiment, the plurality of capacitors carried by the secondary board are arranged in a circle small enough for them to be fitted circumferentially inward from the plurality of capacitors carried by the primary board.

In one embodiment, a termination is centered at the common center of the primary and secondary boards. The termination may be shared by the primary board and the secondary board. For example, the termination may include a first conductor electrically connected to the first leg of the plurality of capacitors on the primary board and the first leg of the plurality of capacitors on the secondary board, and a second conductor electrically connected to the second leg of the plurality of capacitors on the primary board and the second leg of the plurality of capacitors on the secondary board.

In one embodiment, the length of the electrical flow path from the first conductor to the first legs of the plurality of capacitors is approximately equal to the length of the electrical flow path from the second conductor to the second legs of the plurality of capacitors.

The present invention provides improved capacitor packaging in which a substantially symmetrical arrangement of capacitors about the termination provides substantially equal current sharing. In some applications, the electrical flow paths to opposite legs of the capacitors may substantially overlap, thereby achieving lower package inductance. The present invention helps to ensure symmetric current sharing between parallel capacitor branches. Additionally, those embodiment that provide lower package inductance will also improve semiconductor switching performance. Further, symmetrical current sharing will improve capacitors' lifetime.

These and other features of the invention will be more fully understood and appreciated by reference to the description of the embodiments and the drawings.

BRIEF DESCRIPTION OF THE DRAWINGS

This patent or application file contains at least one drawing executed in color. Copies of this patent or patent application with color drawing(s) will be provided by the Office upon request and payment of the necessary fee.

FIG. 4A is a perspective view of a capacitor packaging in accordance with a second exemplary embodiment of the present invention.

FIG. 4B is a top plan view of the capacitor packaging of FIG. 4A.

FIG. 4C is a side elevational view of the capacitor packaging of FIG. 4A.

FIG. 13A is a plan view showing the primary board of a two-board embodiment of the present invention.

FIG. 13B is a plan view showing the secondary board of a two-board embodiment of the present invention.

FIG. 14 is an exploded perspective view of the two-board embodiment of FIG. 13.

FIG. 15A is a top perspective view of the primary board.

FIG. 15B is a bottom perspective view of the secondary board.

FIG. 16A is a perspective view of a first conductor.

FIG. 16B is a perspective view of a second conductor.

FIG. 16C is a perspective view of a connector.

Figure 1:
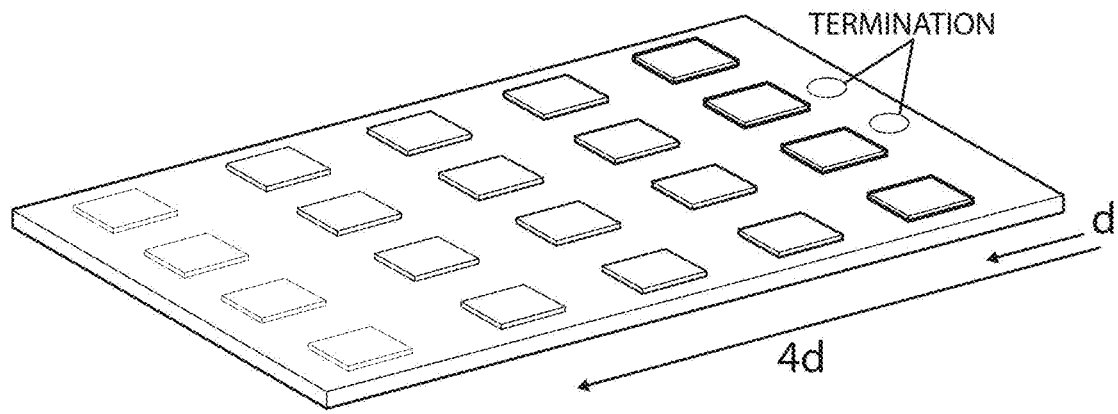
FIG. 1 is a perspective view of an exemplary capacitor packaging according to the prior art.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. In addition, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DESCRIPTION OF CURRENT EMBODIMENTS

Overview.

Figure 2:
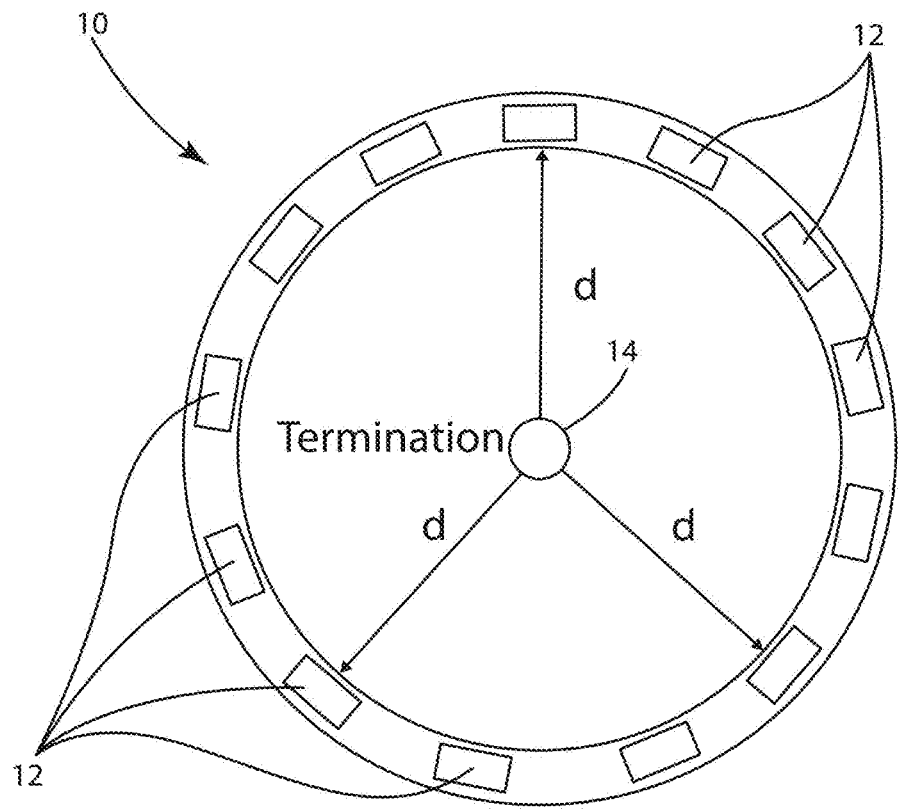
FIG. 2 is a representation view of circular capacitor array in accordance with an embodiment of the present invention.

Capacitor packaging arrangements in accordance with different embodiments of the present invention are shown and described herein. A general representation of a capacitor package in accordance with an embodiment of the present invention is shown in FIG. 2. As shown, the capacitor package 10 of FIG. 2 has a central termination 14 and a plurality of capacitors 12 arranged around the termination 14 at substantially equal distances, d. Alternative implementations of the present invention are show, for example, in FIGS. 3A-C, 4A-C, 7 and 8. In each of the illustrated embodiments, the capacitor packaging 110, 210, 310 and 410 includes a plurality of capacitors 112, 212, 312 and 412 arranged around a centrally located termination 114, 214, 314 and 414 with the electrical flow paths between the capacitors 112, 212, 312 and 412 and the termination 114, 214, 314 and 414 being of substantially equal lengths, thereby providing improved current sharing. In some of the illustrated embodiments, the capacitors 112, 212, 312 and 412 are arranged in a circle and the termination 114, 214, 314 and 414 is centered on the center of that circle. In the illustrated embodiment, the termination 114, 214, 314 and 414 includes a first terminal and second terminal. In the illustrated embodiments, the capacitor packaging 110, 210, 310 and 410 includes a first electrical flow path extending between the first terminal and a first leg of each capacitor and a second electrical flow path extending between the second terminal and a second leg of each capacitor. The first and second electrical flow paths may overlap one another to provide lower package inductance.

Figures 3A, 3B:
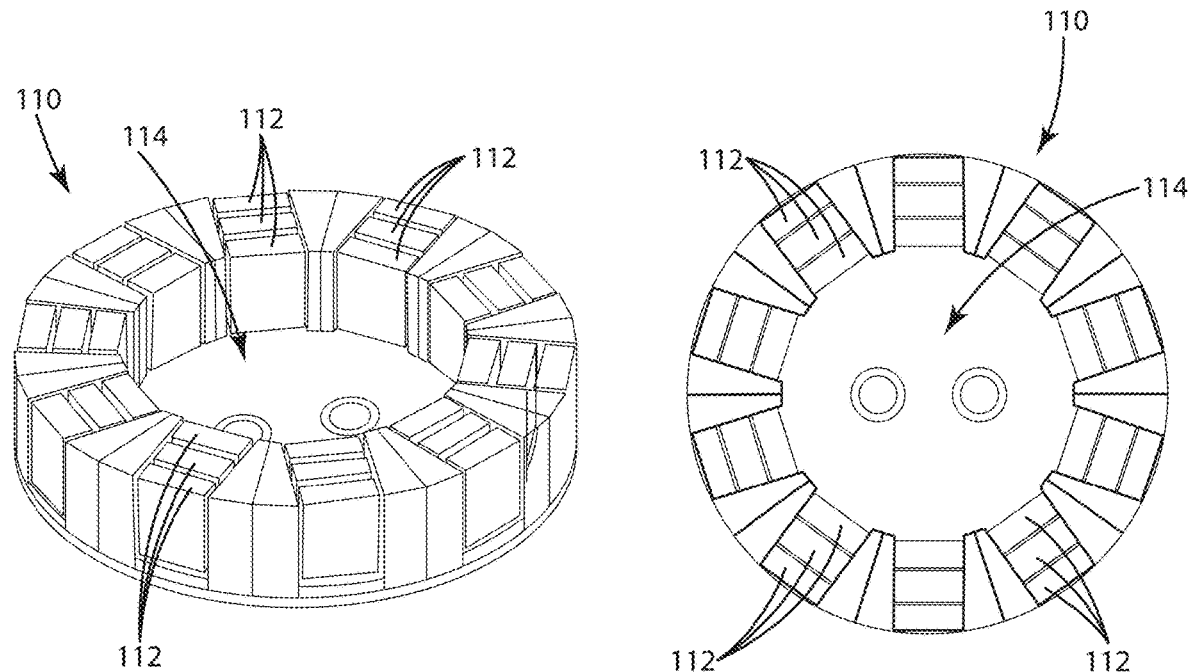
FIG. 3A is a perspective view of a capacitor packaging in accordance with a first exemplary embodiment of the present invention.
FIG. 3B is a top plan view of the capacitor packaging of FIG. 3A.
Figure 3C:
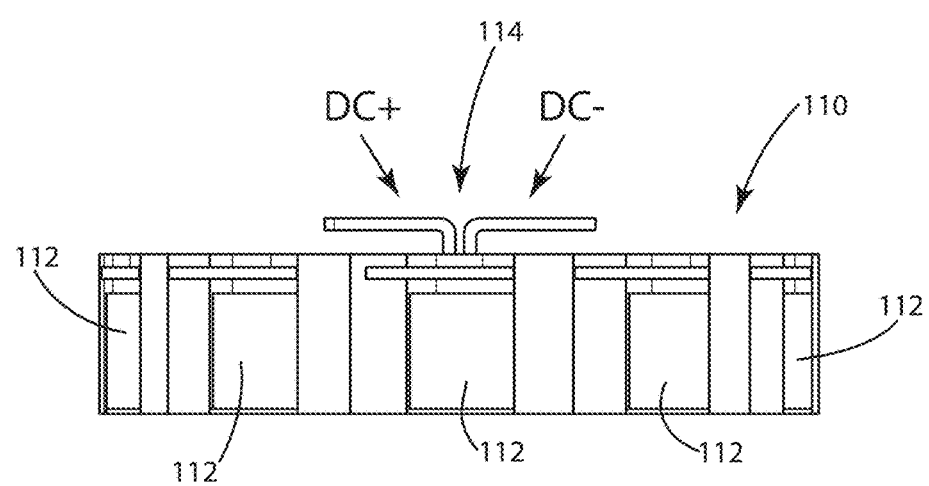
FIG. 3C is a side elevational view of the capacitor packaging of FIG. 3A.

In some illustrated embodiments, the capacitors 112, 212, 312 and 412 are bundled in groups and each group of capacitors (rather than each individual capacitor) is arranged about and at substantially the same distance from a central termination 114, 214, 314 and 414. The grouping of capacitors may facilitate manufacture without unduly reducing the benefits of the present invention. For example, each capacitor group may include a plurality of capacitors mounted to a carrier, and the carriers with associated capacitors may be positioned in a circular arrangement about the termination. In the embodiments of FIGS. 3A-C and 4A-C, each group of capacitors includes three individual capacitors mounted to a carrier. The orientation at which the capacitors are situated within the carrier may vary from application to application. In FIGS. 3A-C, the capacitors in each group are disposed adjacent to one another in substantial radial alignment (e.g. along a common radius extending from the center). In FIGS. 4A-C, the capacitors of each group are disposed in substantial circumferential alignment (e.g. along a line perpendicular to a radius extending from the center). In alternative embodiments, the capacitors may be positioned in the carrier in other arrangements.

Capacitor Packaging Arrangements.

The present invention will now be described in further detail with reference to the drawings. Multiple embodiments of circular capacitor packaging configured to improve the electrical performance of the capacitor bank are described below. For purposes of this disclosure, the phrase "circular capacitor packaging" refers broadly to an arrangement of three of more capacitors or groups of capacitors in which the individual capacitors or the groups of capacitors are arranged at substantially the same distance from a common central point (e.g. the center of the circle upon or about with the capacitors are arranged).

FIGS. 3A-C and 4A-C show examples of two different embodiment of circular capacitor packages 110 and 210 that incorporate groups of capacitors 112 and 114 that are arranged in a generally circular pattern. FIG. 3A-C show a capacitor package 110 in which each group of capacitors 112 includes three capacitors in substantial radial alignment (e.g. disposed adjacent to one another along a radius extending from about the center). FIG. 4A-C show a capacitor package 210 in which each group of capacitors includes three capacitors 212 in substantial circumferential alignment (e.g. disposed adjacent one another along a line extending substantially perpendicularly to a radius extending from the center). Both circular-package designs 110 and 210 have the same dimensions, but capacitor packaging 210 can be produced with fewer manufacturing steps. Thus it may be most cost-effective. Although grouping the capacitors 112, 212 may introduce a small level of asymmetry, the grouping of capacitors can facilitate manufacture without unduly impacting the performance of the capacitor packaging.

FIG. 4 shows a flat capacitor board B that has been designed to compare its performance with the disclosed circular-package designs 110 and 112 of FIGS. 3A-C and 4A-C using a finite element (FE) simulation platform. As shown, the flat board B has a plurality of capacitors that are bundled in groups of three and arranged by groups in a rectangular array with the termination T disposed along one edge. For purposes of this disclosure, the terms "flat capacitor board" and "flat board" generally refer to capacitor boards in which the capacitors are arranged in rectangular arrays, such as regular, repeating rows and columns of capacitors.

Finite element ("FE") characterizations of capacitor package 110, capacitor package 210 and flat board B were modeled and analyzed. Lead lanthanum zirconate titanate (PLZT) based capacitors were used in these analyses. Results of the FE characterization are shown in FIGS. 6A and 6B.

Figure 6A:
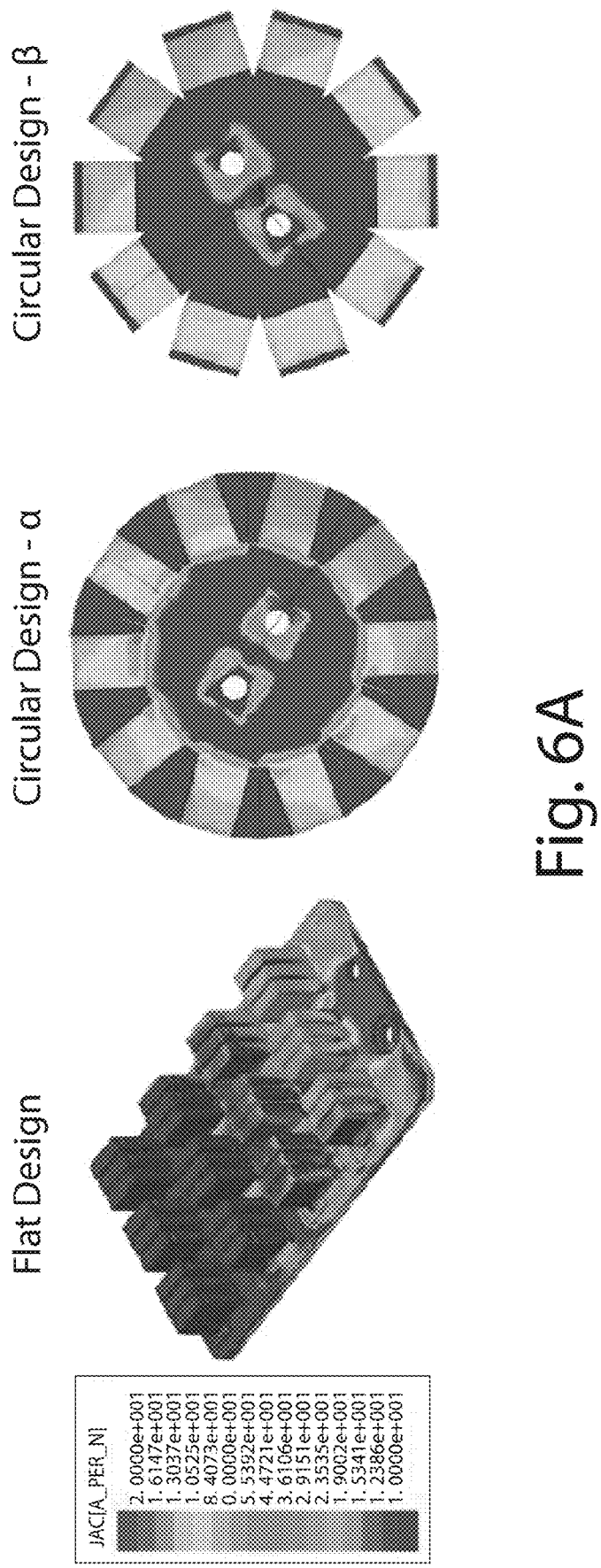
FIG. 6A includes current density mappings of the prior art flat design, the first exemplary embodiment of the present invention and the second exemplary embodiment of the present invention.
Figure 6B:
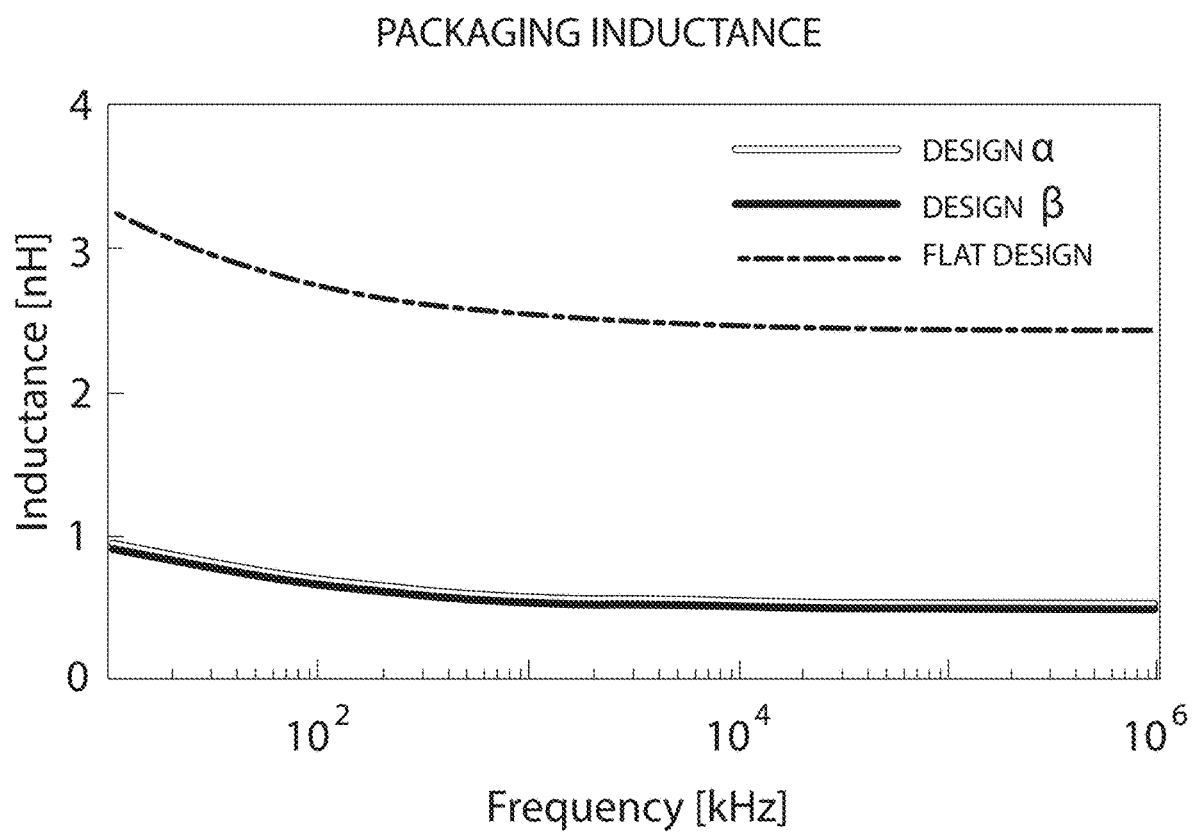
FIG. 6B is a plot of inductance against frequency showing packaging inductance for the flat design of the prior art, the first exemplary embodiment of the present invention and the second exemplary embodiment of the present invention.

FIG. 6A shows the surface current density of the different capacitor packages 110, 210 and B. As shown, both circular capacitor designs 110 and 210 have generally symmetrical current distribution. In contrast, in the flat design B, the first row capacitors take most of the current. Thus, the first row capacitors will have a tendency to fail faster due to thermal stress. FIG. 6B is a plot of the inductance of the capacitor packages 110, 210 and B. As shown, the flat capacitor board has a higher inductance than the circular-package designs 110 and 210.

Figure 7A:
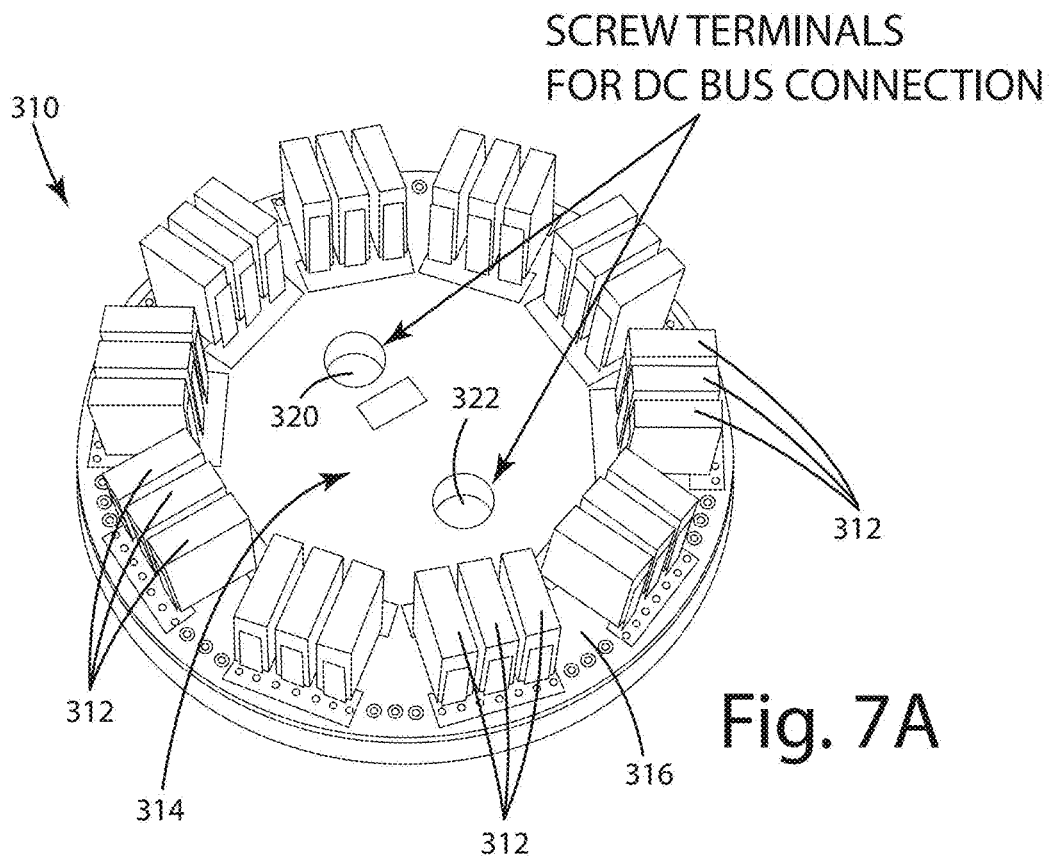
FIG. 7A is a top perspective view of the capacitor packaging of FIGS. 4A-C.
Figure 7B:
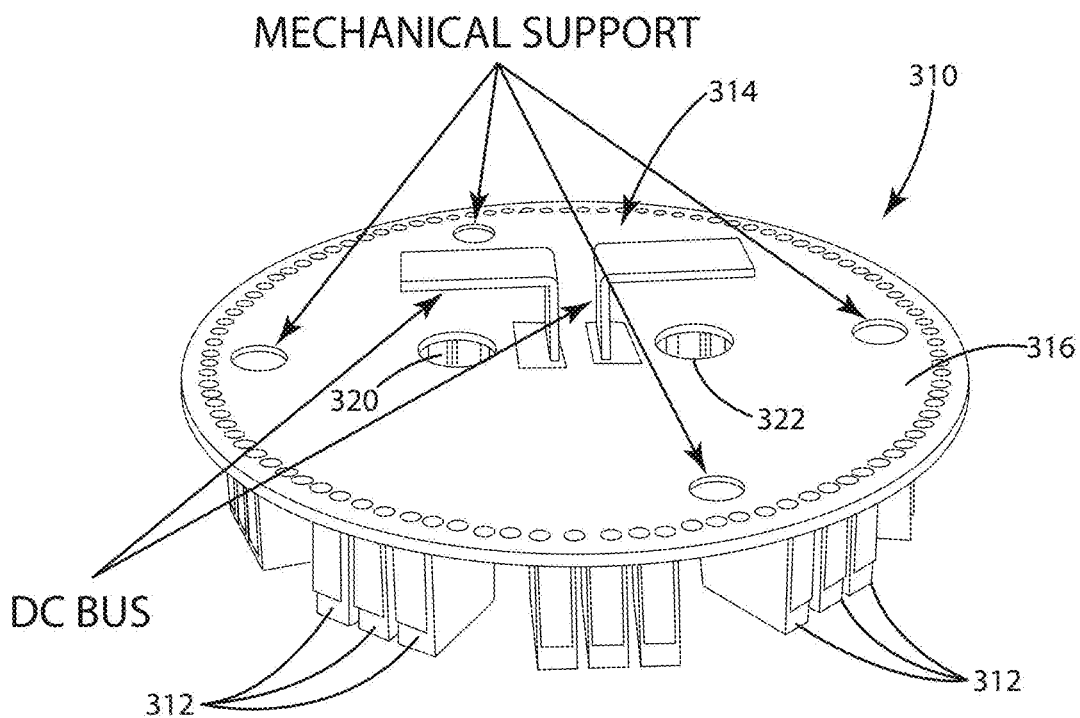
FIG. 7B is a bottom perspective view of the capacitor packaging of FIGS. 4A-C.

FIGS. 7A and 7B shows an example of a circular-package design 310 manufactured using a printed circuit board ("PCB") 316. In this embodiment, the PCB 316 is generally circular and is sized to accommodate the circular arrangement of capacitors 312. The size and shape of the PCB may vary from application to application. For example, in alternative embodiments, the PCB need not be circular and/or it may be larger than needed to accommodate the arrangement of capacitors. In this embodiment, the capacitor board includes 30 capacitors 312 arranged in groups of three. The number of groups and the number of capacitors 312 in each group may vary from application to application. Referring again to FIGS. 7A-B, the groups of capacitors 312 are arranged in a circular pattern with the groups oriented symmetrically with respect to the center of the circle. In this embodiment, the capacitors 312 are electrically connected in parallel. In this example, the capacitor board defines two holes 320 and 322 for screw terminals (not shown). Although not shown, a first terminal is mounted in the first hole where it is comes into electrical contact with a first electrical flow path (not shown) electrically connected to a first leg of each capacitor 312 and a second terminal is mounted in the second hole where it is comes into electrical contact with a second electrical flow path (not shown) electrically connected to a second leg of each capacitor 312. For example, in one embodiment, the first major surface of the printed circuit board 316 includes a first trace (not shown)) that extends from the first hole 320 to the first leg of each capacitor 312 and the second major surface of the printed circuit board 316 includes a second trace (not shown) that extends from the second hole 322 to the second leg of each capacitor 312. In this embodiment, the terminal holes 320 and 322 introduce layout asymmetry between parallel capacitor branches. Other embodiments of circular-package designs described below have terminations disposed in the center of the circular array of capacitors to avoid the asymmetry associated with the use of spaced holes (as shown in FIGS. 8A, 9 and 13A-18).

Figure 8A:
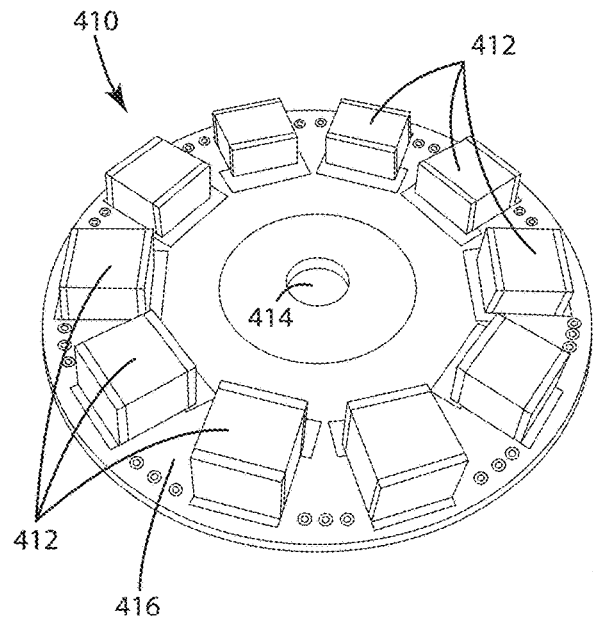
FIG. 8A is a perspective view of a 10-capacitor circular arrangement with a single central hole.
Figure 8B:
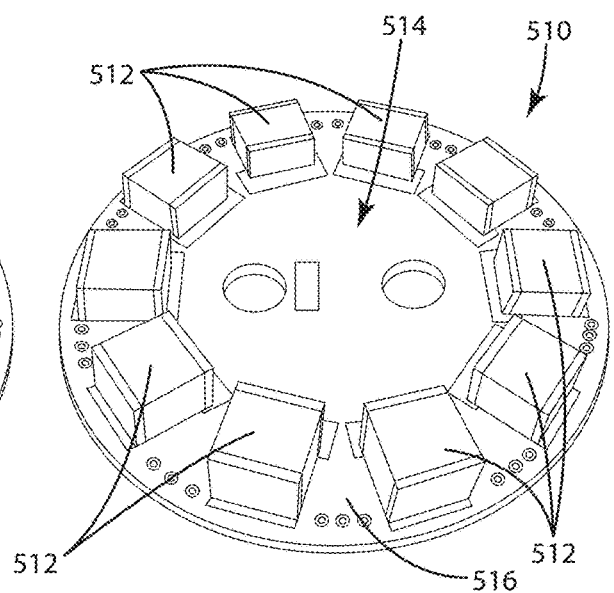
FIG. 8B is a perspective view of a 10-capacitor circular arrangement with a pair of central holes.
Figure 8C:
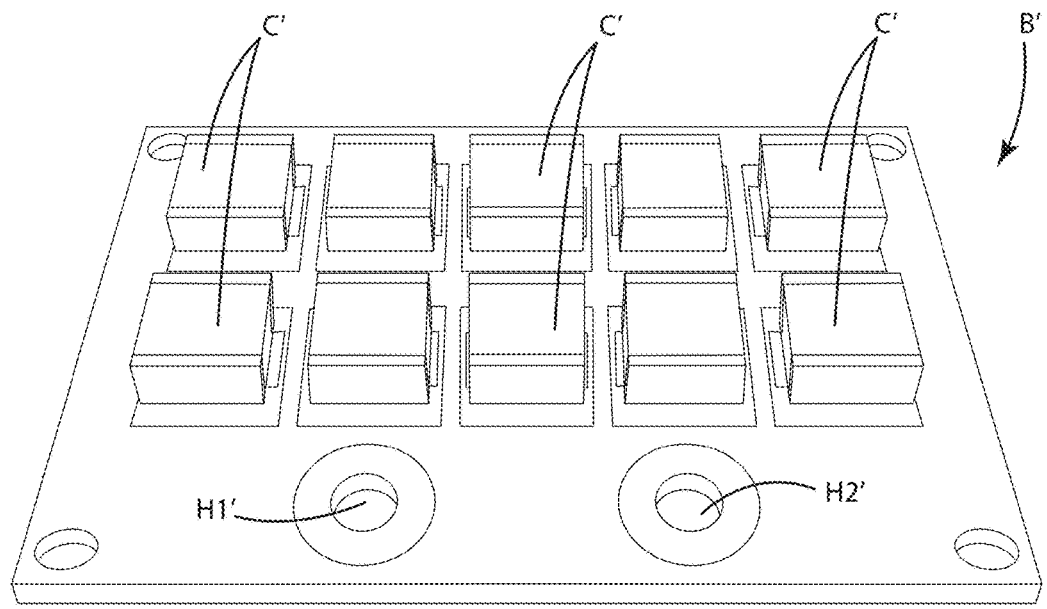
FIG. 8C is a perspective view of a 10-capacitor rectangular array in accordance with the prior art.

FIGS. 8A, 8B and 8C shows three alternative capacitors boards—two according to the present invention and one according to the prior art. More specifically, FIGS. 8A and 8B show two alternative capacitor boards 410 and 510 manufactured in accordance with alternative embodiments of the present invention, while FIG. 8C shows a conventional capacitor board B' with the capacitors C' positioned in a conventional rectangular arrangement. In FIG. 8A, the capacitor package 410 with a capacitor board 416 that includes an arrangement of 10 capacitors 412 disposed in a circular arrangement. In this embodiment, individual capacitors 412 (rather than groups of capacitors) are disposed about a circle. The capacitors 412 are electrically connected in parallel with one another. In this embodiment, the capacitor board 416 has a circular design with center termination 414 to reduce asymmetry that would result from spaced terminations.

In FIG. 8B, the capacitor package 510 includes a capacitor board 516 with 10 capacitors 512 disposed in a circular arrangement, much like the capacitor board 416 of FIG. 8A. In this example, the capacitor board 516 defines two holes 520 and 522 for screw terminals. As noted above, the holes 520 and 522 introduce layout asymmetry between parallel capacitor branches.

FIG. 8C shows a conventional flat capacitor board B' for comparison. In this embodiment, the 10 capacitors C' are arranged in a conventional rectangular array with two rows of five capacitors C'. The capacitor board B' defines two holes H1' and H2' to receive screw terminals. The holes H1' and H2' are disposed to one side of the capacitor array.

Figure 9:
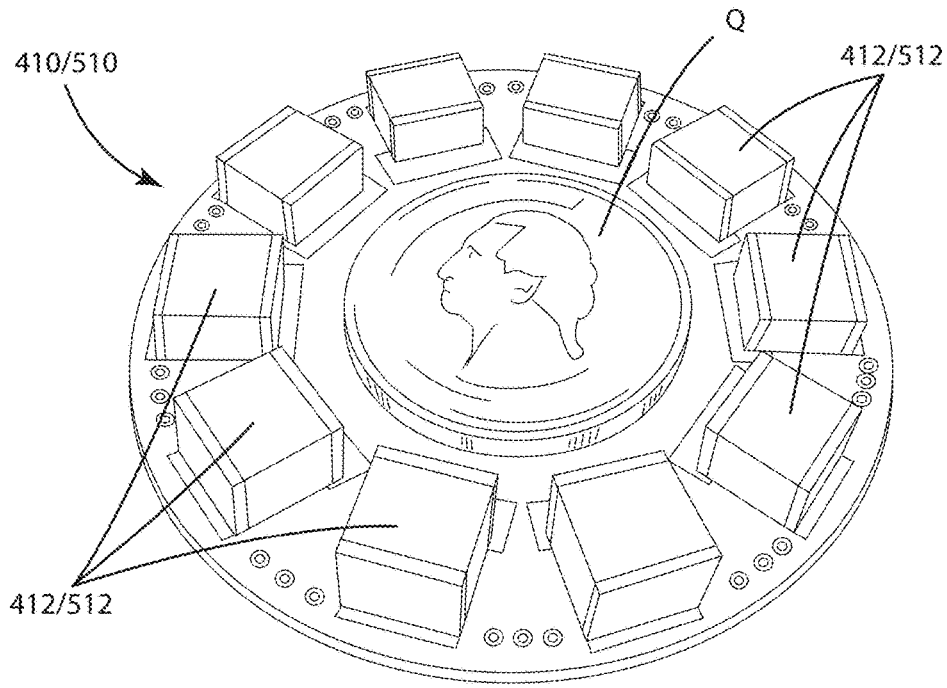
FIG. 9 is a perspective view of a 10-capacitor circular array shown with a quarter to provide a size comparison.

FIG. 9 shows a comparison of the circular designs from FIGS. 8A and 8B to a conventional coin, United States quarter, Q. It should be noted, however, that this illustration is provided merely as an example, and that the size of the design may vary from application to application.

Figure 10:
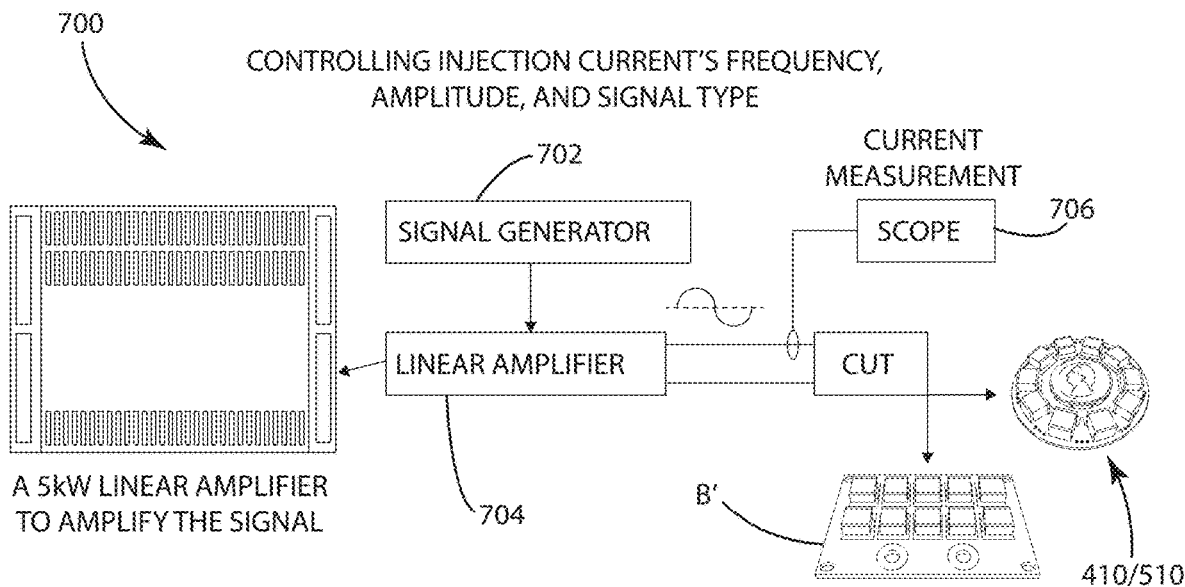
FIG. 10 is a schematic representation of an experimental setup for testing different capacitor packaging options.
Figure 11B:
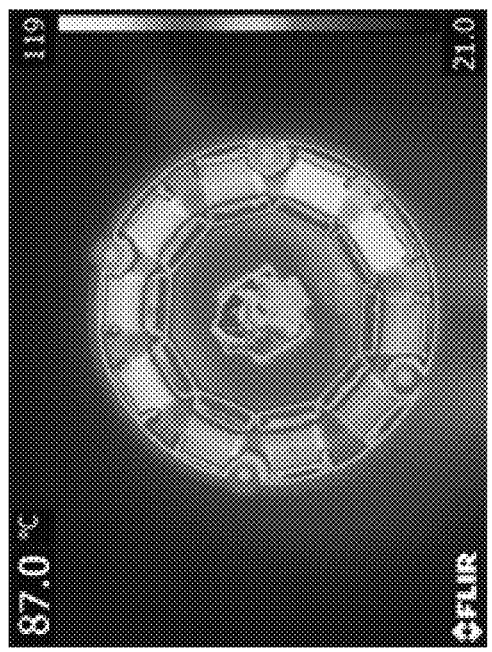
FIG. 11B is a thermal map showing a 10-capacitor circular arrangement.
Figure 11A:
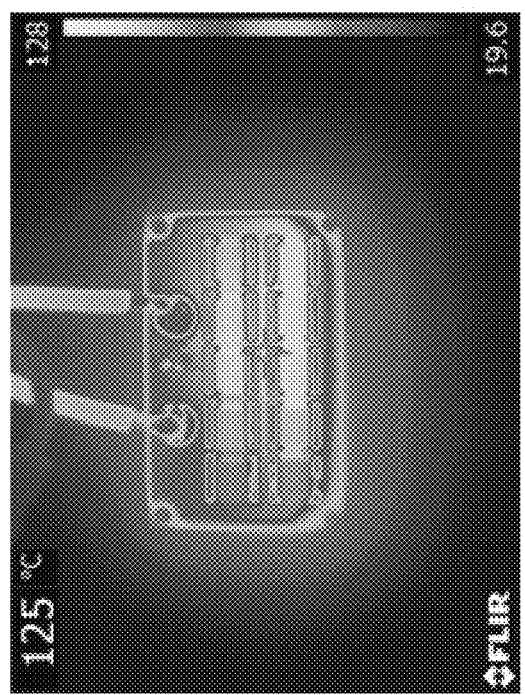
FIG. 11A is a thermal map showing a flat rectangular design of the prior art.

These manufactured capacitor packages of FIGS. 8A and 8C were experimentally characterized and their parameters were extracted. An example of an experimental setup is shown in FIG. 10. In this embodiment, the experimental setup 700 generally includes a signal generator 702 and a linear amplifier 704 that are connected to the capacitor or capacitor package under test ("CUT") (e.g. capacitor packages 410 and B'). A scope 706 or other current measurement device is used to take the desired measurement. Experiments were conducted on capacitor package 410 and capacitor package B' with the following parameters: current of 35 $A_{rms}$, frequency of 35 kHz, ambient temperature of 22° C. and using a sinusoidal signal. Thermal images of the two capacitor packages 410 and B' are shown in FIGS. 11A and 11B. The maximum and minimum temperature for capacitor package B' were 128° C. and 116° C. for a temperature variation of 11° C. The maximum and minimum temperature for capacitor package 410 were 119° C. and 116° C. for a temperature variation of 3° C. The experiments showed that the circular capacitor design exhibited overall 9° C. lower maximum temperature than the flat capacitor board and has only 3° C. temperature difference among the parallel branches. Additional experimental results are shown in Table 1 and in FIGS. 12A-B.

TABLE 1

| Capacitor board parameters. | | |
|---|---|---|
| | Flat | Circular |
| Number of capacitors | 10 | 10 |
| Capacitance @ 400 V | 6 μF | 6 μF |
| Current handling capacity | 70 A | 70 A |
| Inductance @10 MHz | 2.66 nH | 4 nH |
| ESR @ 100 kHz | 550 mΩ | 572 mΩ |
| Resonant frequency | 1.8 MHz | 1.4 MHz |

Figure 12A:
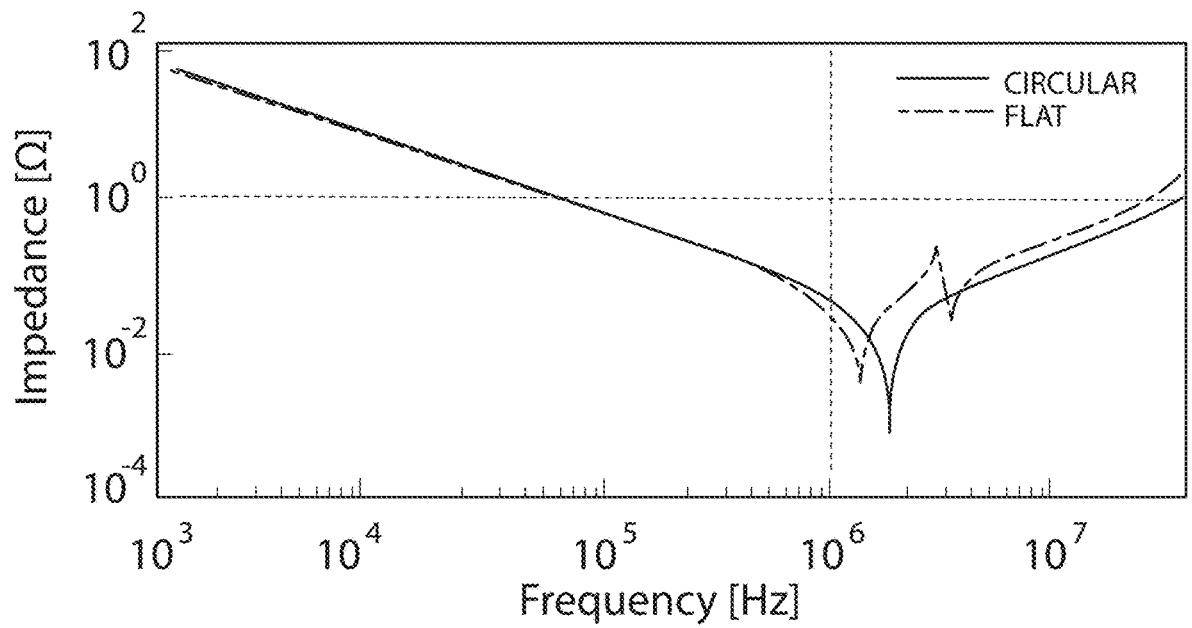
FIG. 12A is a plot of impedance against frequency for the flat 10-capacitor rectangular array of FIG. 8C and the 10-capacitor circular arrangement of FIG. 9.
Figure 12B:
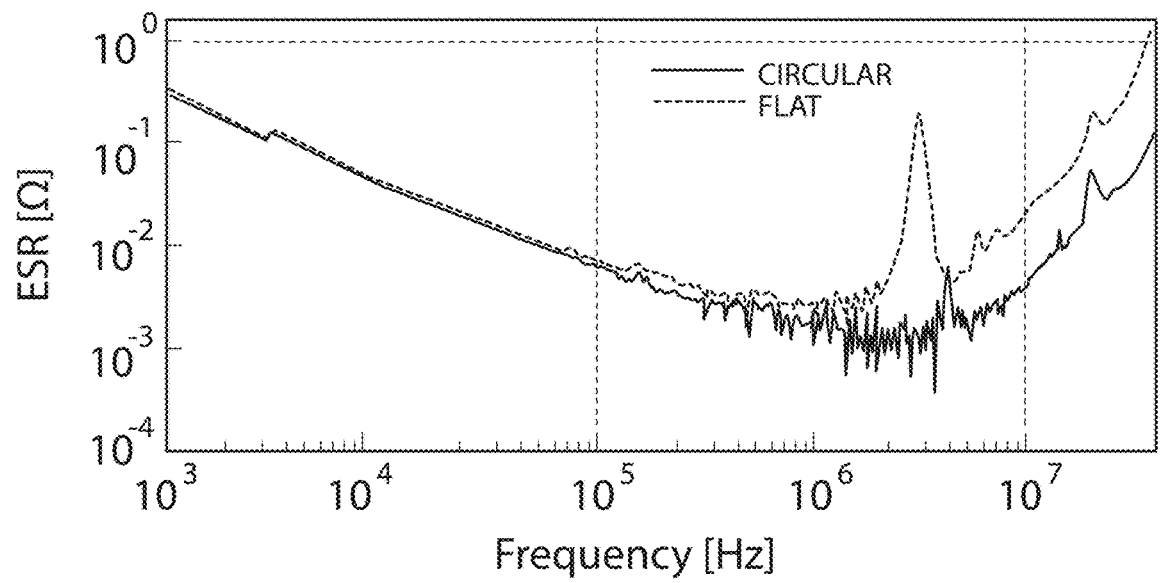
FIG. 12B is a plot of ESR against frequency for the flat 10-capacitor rectangular array of FIG. 8C and the 10-capacitor circular arrangement of FIG. 9.

FIG. 12A is a plot of impedance against operating frequency for the circular package 410 and flat capacitor package B'. This plot shows that the circular capacitor package 410 has a higher operating frequency than the flat capacitor board B'. FIG. 12B is a plot of ESR against operating frequency and it shows that the ESR of the circular capacitor package 410 is lower than the ESR of the flat capacitor board B' at higher operating frequencies.

It can be seen from Table 1 that the circular capacitors have 30% lower inductance than the flat capacitor board and also can be utilized in applications where higher frequency operation is required. Although the electrical performance is much better than the conventional flat design, the circular design shown in FIG. 9 may have lower fill factor due to the empty space in the middle, e.g., where the coin is.

The present invention may be incorporated into alternative embodiments that are configured to provide a higher fill factor. An alternative embodiment of circular capacitor package 610 is described with reference to FIGS. 13A-24. In this alternative embodiment, the capacitor package 610 is configured to provide improved capacitor filling, thereby providing the potential to reduce overall size for a given number of capacitors. The capacitor package 610 generally includes a first capacitor board 616 that provides an outer arrangement of capacitors 612 and a second capacitor board 616' that provides an inner arrangement of capacitors 612'. Referring now to FIGS. 13-18, the capacitor package 610 includes a top capacitor board 616 and a bottom capacitor board 616' that are fitted together to form an assembly including nested circular arrangements of capacitors 612 and 612' disposed about a centrally-positioned termination 614. In this embodiment, the termination 614 is sandwiched between and shared by the two capacitor boards 616 and 616' (as discussed in more detail below). The top capacitor board 616 of this embodiment is essentially identical to capacitor board 316 described above, except that it includes a central termination 614 as described in more detail below. The top capacitor board 616 includes 30 capacitor arranged in 10 groups of three capacitors with the groups of capacitors arranged in a relatively tight circular pattern about the termination 614. The top capacitor board 616 includes a first major surface (the inner surface when the two boards 616 and 616' are assembled) upon which extends a first trace 620. The first trace 620 provides an electrical flow path from the termination 614 to the first leg of each capacitor 612 disposed on the top capacitor board 616. The top capacitor board 616 also includes a second major surface (the outer surface when the two boards 616 and 616' are assembled). A second trace 622 is disposed on the second major surface to provide an electrical flow path from the termination 614 to the second leg of the capacitors 612 on the top capacitor board 616. The top capacitor board 616 also defines a central hole 624 through which a fastener extends for joining together the top and bottom boards 616 and 616'.

The bottom capacitor board 616' is somewhat similar to the top capacitor board 616 in that it includes a circular printed circuit board that supports a plurality of capacitors 612' and is configured to interface with the termination 614. As can be seen, the capacitors 612' of the bottom capacitor board 616' are disposed about the termination 614 at a radius that permits the capacitors 612' of the bottom capacitor board 616' to fit inwardly of the capacitors 612 of the top capacitor board 616. For example, as shown, the bottom capacitor board 616' may include 15 capacitors 612' arranged in five groups of three capacitors with the groups of capacitors arranged in a relatively tight circular pattern about the termination 614. Similar to the top capacitor board 616, the bottom capacitor board 616' includes a first trace 620' on its inner surface (e.g. the surface facing the top capacitor board when assembled) that provides an electrical flow path from the termination 614 to the first leg of the capacitors 612' and a second trace 622' on its outer surface that provides an electrical flow path from the termination 614 to the second leg of the capacitors 612'.

As perhaps best shown in FIG. 14, the capacitor package 610 also includes a standoff assembly 630 intended to intersecure and maintain the desired spacing between the top and bottom capacitor boards 616 and 616'. In this embodiment, the standoff assembly 630 and the termination 614 are integrated. As shown, the termination 614 includes a first terminal 632 (e.g. DC+), a second terminal 634 (e.g. DC−), an isolating sleeve 636, a screw 638, a washer 640 and a nut 642. In this embodiment, the first terminal 632 is sandwiched between the top and bottom capacitor boards 616 and 616', and includes a relatively large mass of conductive material that is dimensioned to function as a spacer between the top and bottom capacitor boards 616 and 616'. The first terminal 632 is in electrical contact with the inner traces 620 and 620' on the top and bottom capacitor boards 616 and 616'. The first terminal includes 632 two legs 644 that extend through corresponding slots 646' in the bottom capacitor board 616' so that they are accessible from the exterior of the capacitor package 610. The first terminal 632 defines a central hole 648 through which the screw 638 passes to intersecure the top and bottom capacitor board 616 and 616'. The hole is of sufficient diameter to receive the screw 638 and an isolating sleeve 636. The second terminal 634 is disposed against the outer surface of the bottom capacitor board 616' and is generally U-shaped with two legs 648 that extends away from the bottom capacitor board 616'. The second terminal 634 is in electrical contact with the outer trace 622' of the bottom capacitor board 616'. The second terminal 634 defines a central hole 650 through which the screw 638 passes to intersecure the top and bottom capacitor boards 616 and 616'. The screw 638 extends through the top capacitor board 616, the first terminal 632, the bottom capacitor board 616' and the second terminal 634, and is secure by a nut 642 and washer 640. The washer is in electrical contact with the outer trace on the top capacitor board. The isolation sleeve is manufactured from an insulating material and is fitted within the hole in the first terminal about the screw to provide electrical insulation between the screw and the first terminal.

Figure 17A:
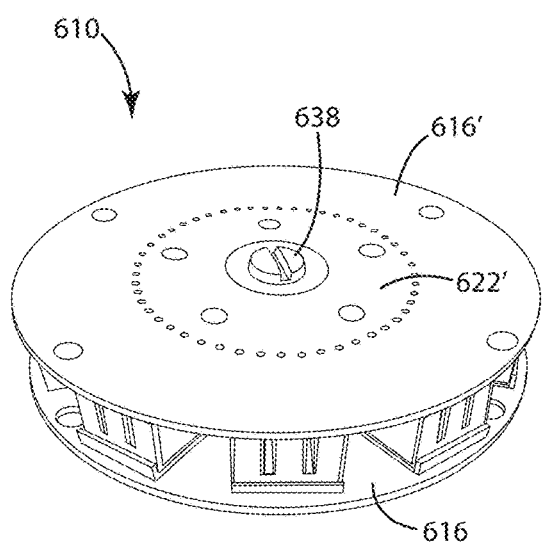
FIG. 17A is a top perspective view of the assembled two-board embodiment.
Figure 17B:
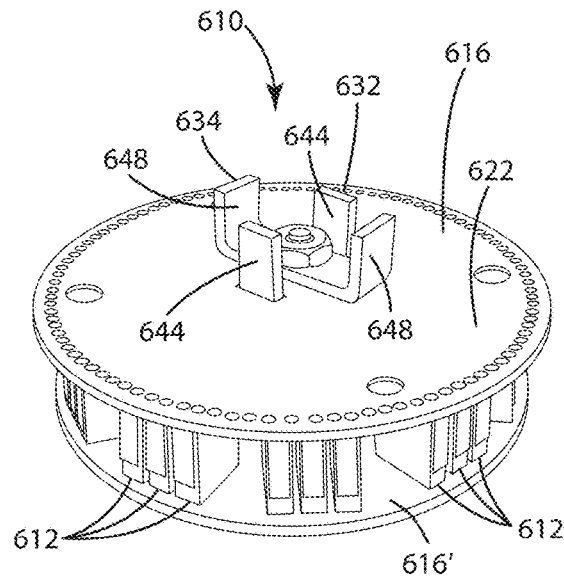
FIG. 17B is a bottom perspective view of the assembled two-board embodiment.
Figure 18:
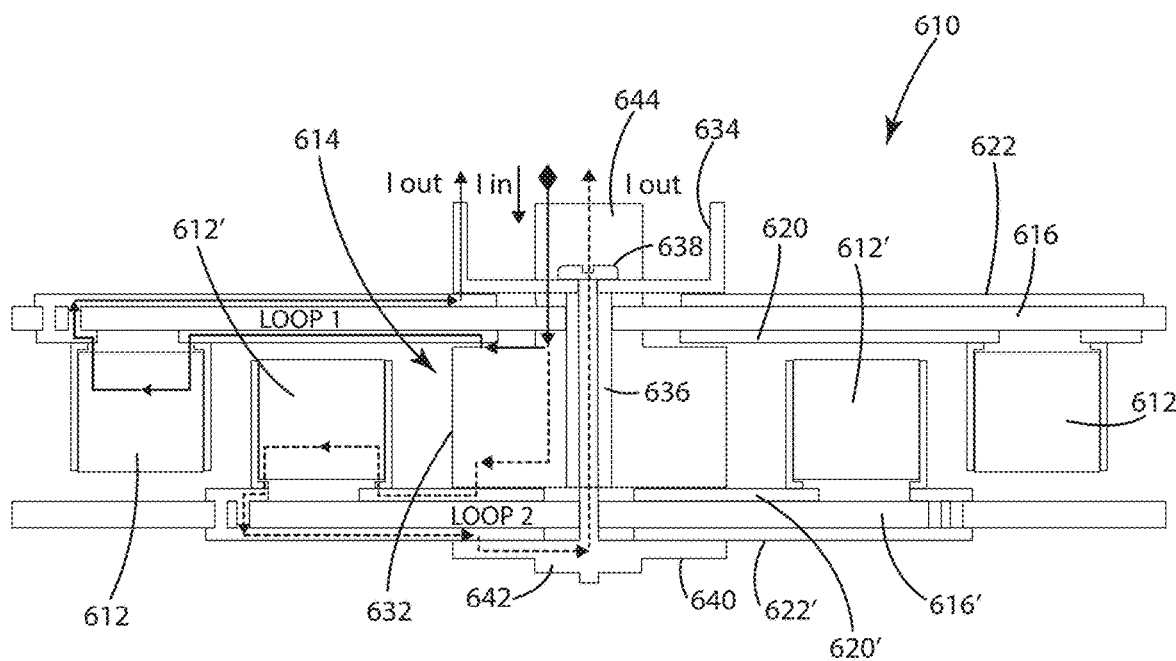
FIG. 18 is a representational sectional view of the two-board embodiment.

The orientation of the standoff assembly 630 may vary from application to application. For example, FIGS. 15 and 17A-B show capacitor package 610 with the standoff assembly 630 inverted. In this embodiment, the legs 644 of the first terminal 632 extend through slots in the top capacitor board 616 and the second terminal 634 is disposed against the outer surface of the top capacitor board 616. The screw 636, washer 640 and nut 642 are also reversed.

The illustrated standoff assembly 630 is merely exemplary and it may be replaced with alternative structure capable of maintain the desired spacing between the two capacitor boards 616 and 616' and capable of providing the terminals 632 and 634 and electrical flow paths between the traces 620, 620', 622 and 622'. While the illustrated standoff assembly 630 is capable of spacing the boards 616 and 616' and providing the necessary electrical flow paths, these function may be provided by separate components in alternative embodiments.

In the illustrated embodiment, the electrical flow paths to and from the capacitors in the top circuit board and the bottom circuit board are of substantially the same length. For example, with reference to the cross-sectional representational view of capacitor package 610 shown in FIG. 18, Loop 1 and Loop 2 are of substantially the same length. Loop 1 represents a current flow path from the connection point on the first terminal 632, through the inner trace 620 on the top circuit board 616, a capacitor 612 on the top capacitor board 616 and back through the outer trace 622 to the connection point on the second terminal 634. Loop 2 represent a current flow path extending from the connection point on the first terminal 632, through the body of the first terminal 632 to the bottom capacitor board 616', along the inner trace 620' of the bottom capacitor board 616', through a capacitor 612', and then through the outer trace 622' on the bottom capacitor board 616' to the washer 640 and then through screw 638 to the connection point on the second terminal 634. As can be seen, the lengths of the current flow paths through the standoff assembly (e.g. through the first terminal to the bottom capacitor board and through the screw, washer and nut to the bottom capacitor board) are substantially equal to the difference in length between the traces on the top capacitor board and the bottom capacitor board.

Although the two capacitor boards in this assembly are referred to as top and bottom capacitor boards, the directional terms are used as an expedient to refer to the capacitor boards' position as shown in the drawings. The present invention is not limited to capacitor board disposed in any particular orientation.

Figure 19:
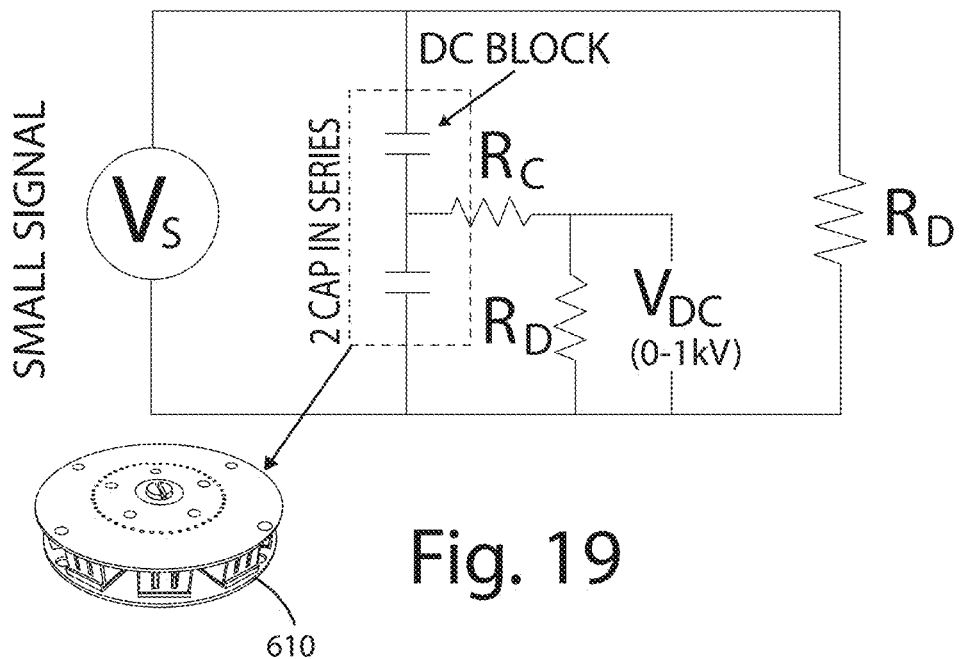
FIG. 19 is a characterization setup used in evaluating select capacitor package parameters.

The capacitor package 610 was characterized to evaluate equivalent circuit parameters at various frequencies, temperatures, and bias voltages. The characterization setup was designed by connecting two similar capacitor packages in series. One was connected to a DC source (for biasing purposes), and the other acted as a DC block. The voltage across the two series capacitors will be zero; thus, any network or component analyzers can be used for small signal analysis. A PCB was designed to characterize the capacitors containing two series capacitor packages, charging—discharging resistors, and a DC supply to vary the bias voltage from 0 V to 800 V. An environmental chamber was used to evaluate the parameters at various operating temperatures (−25° C.-150° C.). A network analyzer was used to inject a small signal and measure the phase and impedance of the two series-connected capacitors. Then the results were postprocessed to identify the equivalent circuit parameters of a single capacitor package. FIG. 19 shows a characterization setup used in testing the capacitor board. As can be seen, the characterization setup includes an AC signal source, $V_S$, which is this embodiment was a network analyzer; the two capacitor packages connected in series; a charging resistor, $R_C$; a pair of discharging resistors, $R_D$; and a DC supply, $V_{DC}$. In this embodiment, the AC signal source, $V_S$, may be a relatively small signal, for example, varying by one volt from peak to peak. The output signal, $V_{DC}$, may go much higher, for example, varying from 0 to 1 kV. Postprocessing was performed using conventional equipment and conventional postprocessing algorithms.

Figure 20:
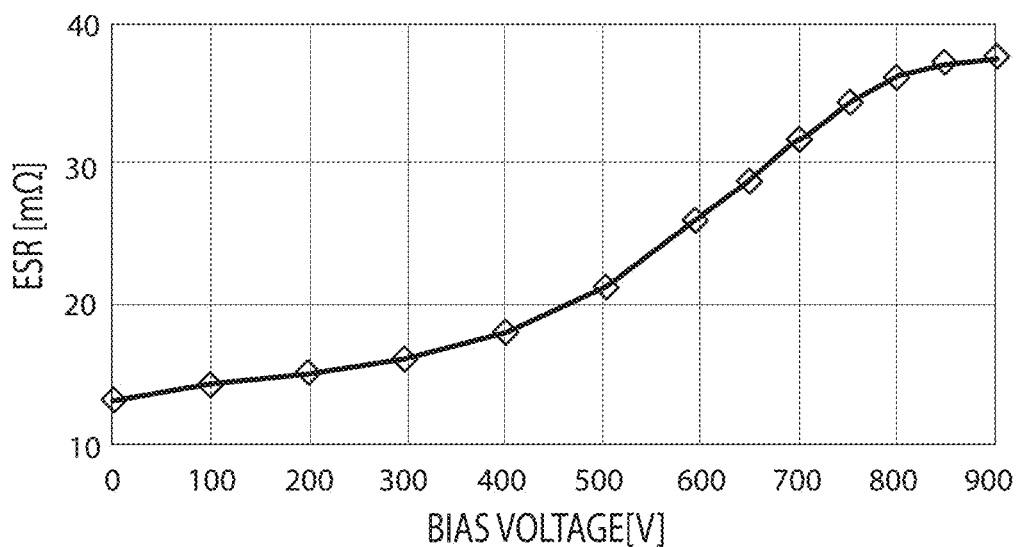
FIG. 20 is a plot of ESR against bias voltage.
Figure 21:
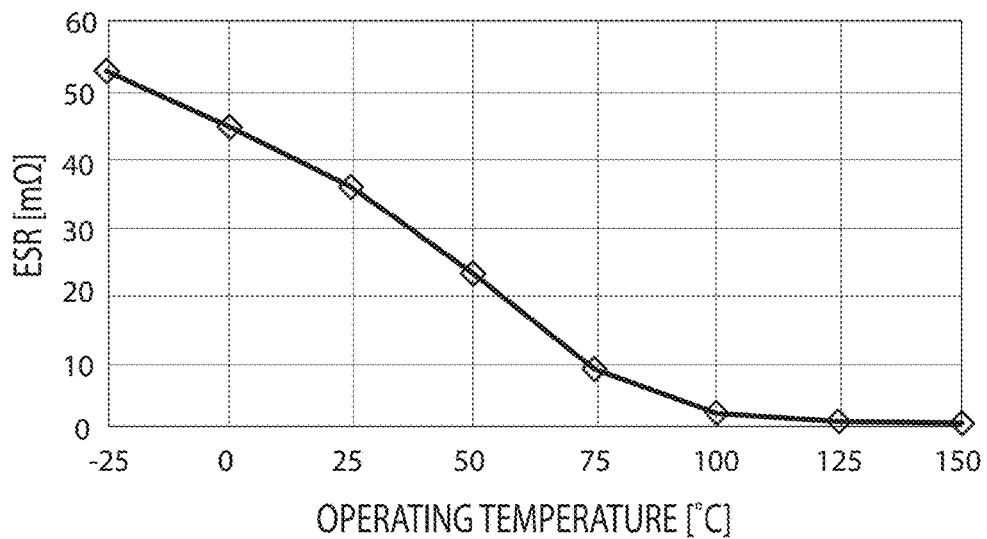
FIG. 21 is a plot of ESR against operating temperature.
Figure 22:
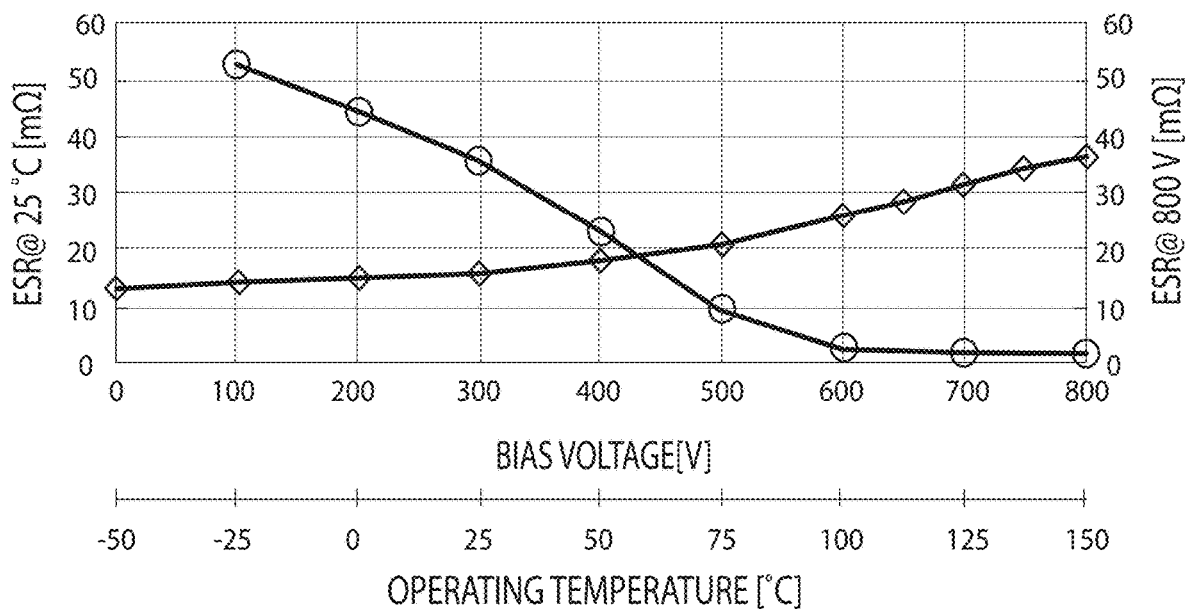
FIG. 22 is a plot showing the change in ESR with bias voltage and temperature.
Figure 23:
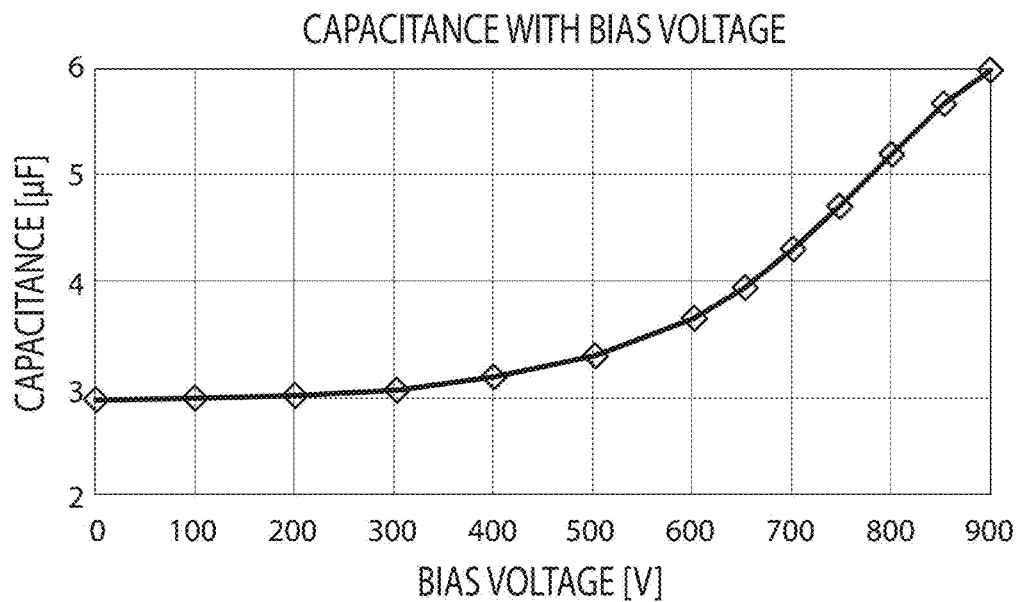
FIG. 23 is a plot of capacitance against bias voltage.
Figure 24:
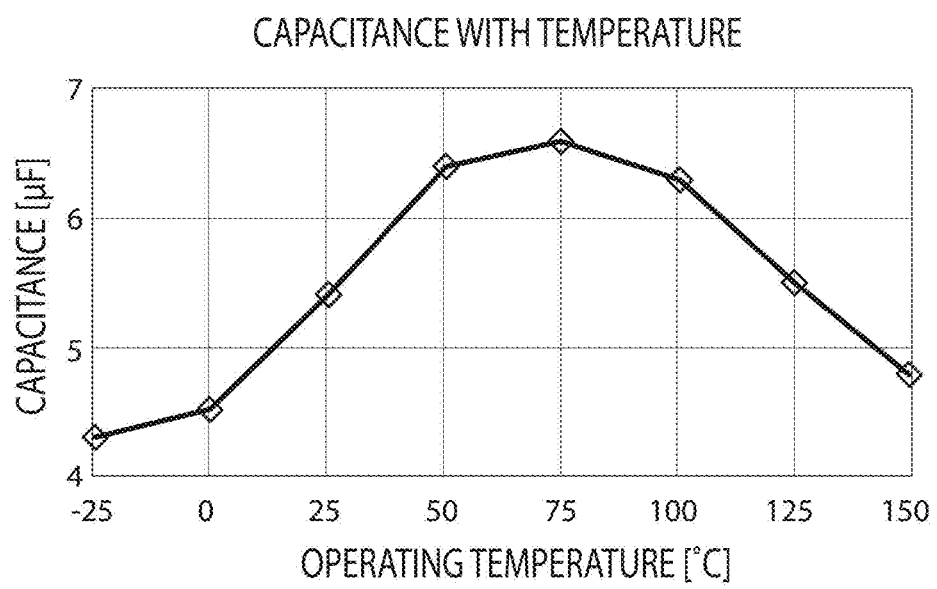
FIG. 24 is a plot of capacitance against operating temperature.

FIG. 20 is a plot of equivalent series resistance ("ESR") against bias voltage. FIG. 21 is a plot of ESR against operating temperature. FIG. 22 is a plot showing changes in EST with bias voltage and temperature. FIG. 23 is a plot of capacitance against bias voltage. FIG. 24 is a plot of capacitance against operating temperature. The capacitance and ESR values in FIGS. 20 and 23 are taken at room temperature with an injection frequency of 100 kHz. The results in FIGS. 22 and 24 are taken at a bias voltage of 800V with a 100 kHz injection frequency.

It can be seen that the capacitance of the capacitor package increases with bias voltage up to 900 V, which is an antiferroelectric behavior. The capacitance value showed a different character when the operating temperature was varied. It can be seen that the designed circular capacitor has a minimum of 4.2 µF capacitance at −25° C. (see FIG. 24) and it increased when the temperature varied from −25° C. to 75° C., then decreased beyond 75° C. This capacitance behavior with temperature ensures current balancing among the parallel capacitor branches and avoids thermal runaway. Another challenge with PLZT capacitors is the increase in ESR with bias voltage, which is much higher than the similarly sized film or other types of ceramic capacitors. On the other hand, the ESR reduces drastically with operating temperature and reaches a steady state at around 100° C., suggesting that this type of capacitor will perform best if operated at or more than 100° C.

Certain general parameters of the circular capacitor are presented in Table 2. The inductance of these capacitors is independent of bias voltage and operating temperature and, thus, measured at zero bias voltage at room temperature (25° C.). An OMICRON Bode 100 network analyzer with two-port shunt through measurement was used to capture a low inductance value. The analyzers can measure down to 1 nH with the measurement technique described in. According to the measurement, the circular capacitor package has a 3.78 nH input inductance measured from the termination points, which is ≈40% less than the flat capacitor boards. This reduction will not only reduce the voltage overshoot but will also improve device-switching performance.

TABLE 2

Capacitor Package Parameters.

| Parameters | Values | Operating Conditions |
|---|---|---|
| Volume | 0.028 L | |
| Capacitance | 6 µF | 50 kHz, 100° C. |
| Current conduction | 150 A | 85 kHz, 25° C. [from datasheet] |
| ESR | 2.73 mΩ | 50 kHz, 100° C. |
| ESL | 3.78 nH | 10 MHz |

Figure 5:
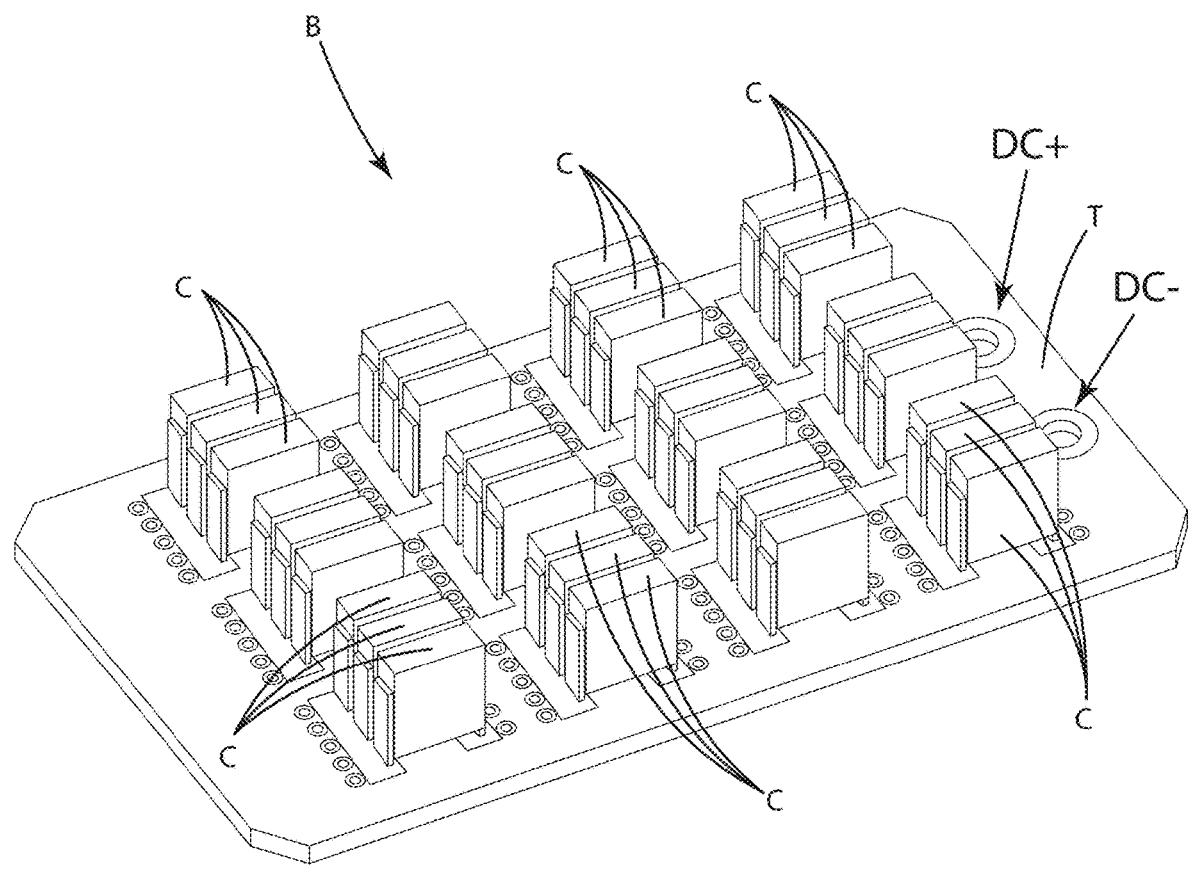
FIG. 5 is a perspective of an exemplary capacitor packaging according to a flat design of the prior art.

Table 3 provides a comparison of select parameters of different capacitor boards. The row labeled "Flat Board" provides parameters of the prior art capacitor package B' of FIG. 5. The row labeled "Design 1" provides parameters of the circular capacitor package 210 of FIGS. 4A-C. The row labeled "Design 2" provides parameters of the circular capacitor package 610 of FIGS. 13-15. As can be seen, even capacitor package 210 provides higher fill factor and higher capacitance density than the prior art capacitor package B', while still providing substantially the same capacitance at 800V. Capacitor package 610 provides an even greater fill factor and capacitance as it provides an additional 15 capacitors within the same packaging constraints as capacitor package 210.

TABLE 3

Comparison of Select Parameters

| | Fill factor | Capacitance density [µF/cm³] | Number of capacitors | Capacitance @800 V [µF] |
|---|---|---|---|---|
| Flat Board (FIG. 5) | 25% | 0.72 | 36 | 4.8 |
| Design 1 (FIGS. 3 & 4) | 27.5% | 0.77 | 30 | 4 |
| Design 2 (FIGS. 14) | 33.6% | 0.94 | 45 | 6 |

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

What is claimed is:

1. Capacitor packaging comprising:
an electrical termination;
a first substrate;
a first bank of three or more capacitors disposed on the first substrate about the electrical termination, wherein the capacitors of the first bank are substantially equidistant from the termination and electrically connected in parallel to each other to the electrical termination;
a second substrate disposed adjacent to the first substrate;
a second bank of three or more capacitors disposed on the second substrate about the electrical termination, wherein the capacitors of the second bank are substantially equidistant from the termination and electrically connected in parallel to each other to the electrical termination.

2. The capacitor packaging of claim 1 wherein the capacitors of the first bank are arranged as vertices of a polygonal contour that surrounds the termination.

3. The capacitor packaging of claim 1 wherein the capacitors of the first bank are arranged in a circular pattern substantially centered on the termination.

4. The capacitor packaging of claim 3 wherein the first bank of capacitors includes a maximum number of capacitors capable of fitting about the circular pattern.

5. The capacitor packaging of claim 1 wherein the capacitors of the first bank are arranged in three or more groups, each group including an equal number of capacitors, the groups being disposed on the first substrate about the electrical termination, where each group is substantially equidistant from the termination.

6. The capacitor packaging of claim 5 wherein each group includes a plurality of capacitors arranged generally in radial alignment.

7. The capacitor packaging of claim 5 wherein each group includes a plurality of capacitors arranged generally in circumferential alignment.

8. The capacitor packaging of claim 5 wherein the first bank of capacitors includes a maximum number of groups capable of fitting about the circular pattern.

9. The capacitor packaging of claim 1 wherein the first substrate includes a first electrical trace that is in electrical communication with a first lead of each capacitor of the first bank and a second electrical trace that is in electrical communication with a second lead of each capacitor of the first bank.

10. The capacitor packaging of claim 9 wherein the first electrical trace is disposed on one major surface of the first substrate and the second electrical trace is disposed on a second major surface of the first substrate.

11. The capacitor packaging of claim 9 wherein the termination includes a first terminal in electrical communication with the first electrical trace and a second terminal in electrical communication with the second electrical trace.

12. The capacitor packaging of claim 1 wherein
the capacitors of the first bank are mounted on a first surface of the first substrate; and
the capacitors of the second back are mounted on a first surface of the second substrate; and
wherein the first and second substrates are arranged with the first surface of the first substrate facing the first surface of the second substrate; and
wherein the second bank of capacitors disposed within a volume enclosed by the first bank of capacitors and the first and second substrates.

13. The capacitor packaging of claim 1 wherein the first substrate comprises a first printed circuit board and the second substrate comprises a second printed circuit board.

14. The capacitor packaging of claim 13, wherein
the first printed circuit board is circularly shaped, and
the capacitors of the first bank are disposed adjacent to, and around, a perimeter of the first printed circuit board.

15. The capacitor packaging of claim 13 wherein the second PCB is shaped like the first PCB.

16. The capacitor packaging of claim 1 wherein the termination includes
a standoff structure sandwiched between the first and second substrates.

17. The capacitor packaging of claim 1 wherein
the termination includes a first terminal and second terminal;
the first substrate including a first trace electrically connecting the first terminal to the first leg of each capacitor in the first bank of capacitors and a second trace electrically connecting the second terminal to the second leg of each capacitor in the first bank of capacitors; and
the second substrate including a first trace electrically connecting the first terminal to the first leg of each capacitor in the second bank of capacitors and a second trace electrically connecting the second terminal to the second leg of each capacitor in the second bank of capacitors.

18. The capacitor packaging of claim 17 wherein the first terminal extends between the first substrate and the second substrate, the first terminal being electrically connected to the first trace of the first substrate and to the first trace of the second substrate.

19. The capacitor packaging of claim 18 wherein
the second terminal is disposed on a second surface of one of the first substrate or the second substrate, the second terminal being electrically connected to the second trace of one of the first substrate or the second substrate, and the standoff structure includes an electrically conductive bridge extending from the second terminal to the second trace of the other of the first substrate or the second substrate.

20. The capacitor packaging of claim 19 wherein the standoff structure includes an insulating sleeve separating the conductive bridge from the first terminal.

21. The capacitor packaging of claim 1 wherein the capacitors of the first bank and of the second bank comprise lead lanthanum zirconate titanate (PLZT) dielectric material.

* * * * *